United States Patent
Chen et al.

(10) Patent No.: US 7,029,723 B2
(45) Date of Patent: Apr. 18, 2006

(54) FORMING CHEMICAL VAPOR DEPOSITABLE LOW DIELECTRIC CONSTANT LAYERS

(75) Inventors: Tian-An Chen, Phoenix, AZ (US); Robert Meagley, Beaverton, OR (US); Kevin P. O'Brien, Portland, OR (US); Michael D. Goodner, Hillsboro, OR (US); James Powers, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/337,524

(22) Filed: Jan. 7, 2003

(65) Prior Publication Data

US 2004/0130031 A1 Jul. 8, 2004

(51) Int. Cl.
*C23C 16/38* (2006.01)
*C23C 16/28* (2006.01)

(52) U.S. Cl. .............................. 427/249.5; 427/255.38
(58) Field of Classification Search ................ 257/618; 428/704, 446; 427/249.5, 255.38
See application file for complete search history.

(56) References Cited

U.S. PATENT DOCUMENTS

| | | | | |
|---|---|---|---|---|
| 3,457,222 | A * | 7/1969 | Stelvio | 528/5 |
| 5,290,897 | A * | 3/1994 | Dougherty | 528/5 |
| 5,932,335 | A * | 8/1999 | Keller et al. | 428/293.4 |
| 6,318,124 | B1 * | 11/2001 | Rutherford et al. | 65/80.8 |
| 6,511,890 | B1 * | 1/2003 | Park et al. | 438/359 |
| 2003/0023118 | A1 * | 1/2003 | Kanayama et al. | 568/4 |

FOREIGN PATENT DOCUMENTS

| DE | 2614324 | * | 10/1977 |
|---|---|---|---|
| JP | 11001561 A | * | 1/1999 |
| JP | 2001261837 A | * | 9/2001 |
| SU | 493488 A | * | 5/1976 |
| SU | 657039 A | * | 4/1979 |

\* cited by examiner

*Primary Examiner*—Stephen Stein
(74) *Attorney, Agent, or Firm*—Trop, Pruner & Hu, P.C.

(57) ABSTRACT

Carborane may be used as a precursor to form low dielectric constant dielectrics. The carborane material may be modified to enable it to be deposited by chemical vapor deposition.

5 Claims, 6 Drawing Sheets

*Ortho*-Carborane

*Para*-Carborane

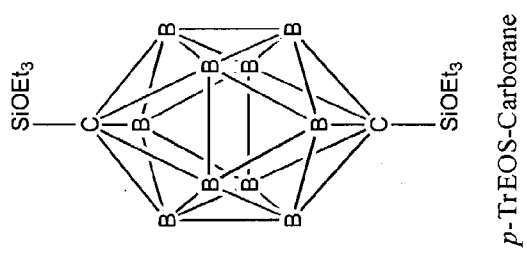
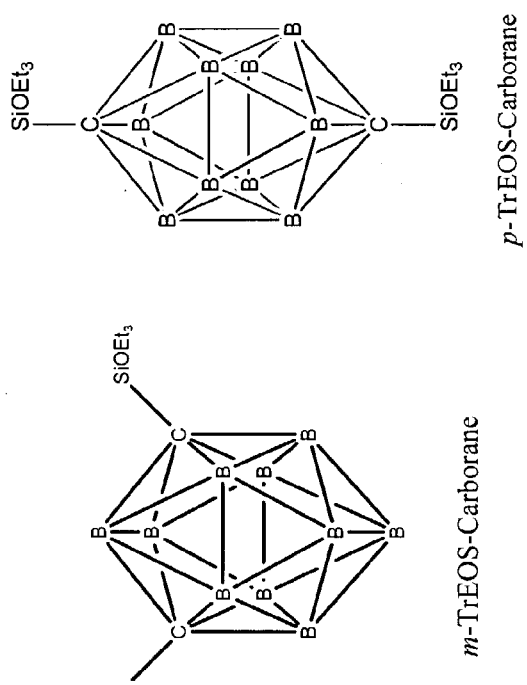
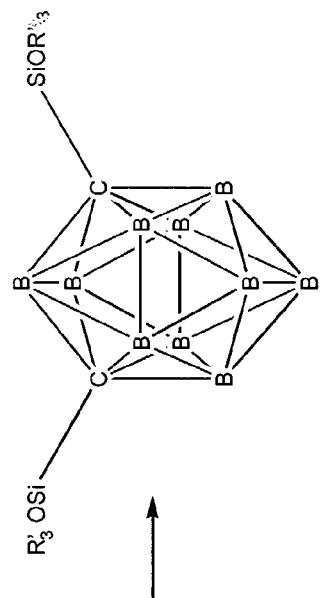
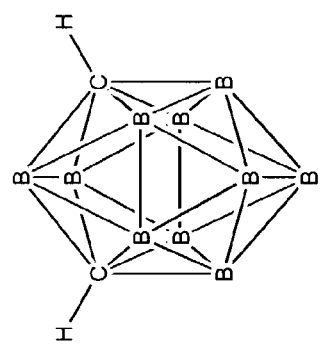
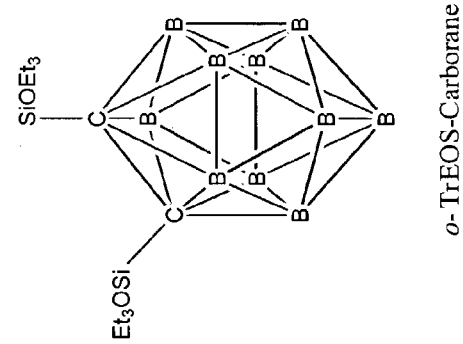
FIG. 5
FIG. 6
FIG. 7
FIG. 8

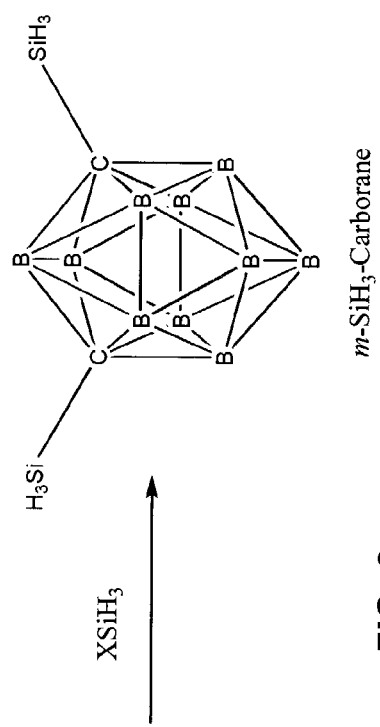
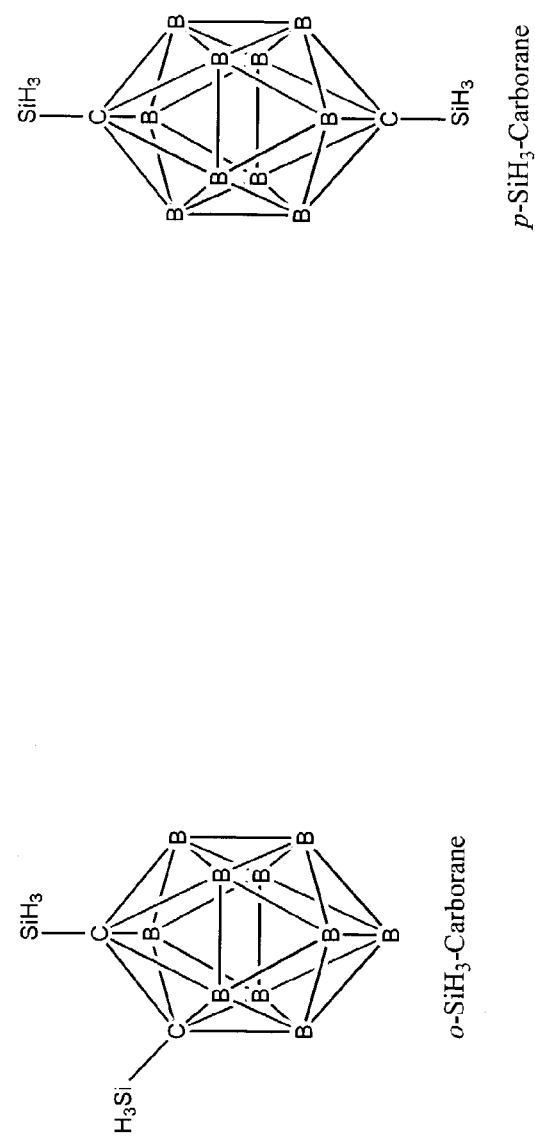
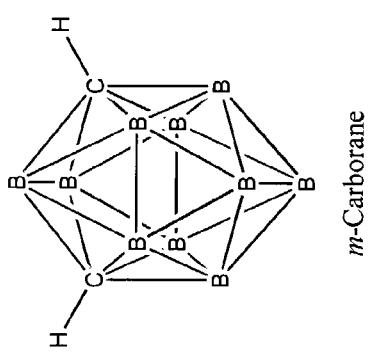
FIG. 9
FIG. 10
FIG. 11

FORMING CHEMICAL VAPOR DEPOSITABLE LOW DIELECTRIC CONSTANT LAYERS

BACKGROUND

This invention relates generally to techniques for forming integrated circuits.

In many integrated circuits, dielectric materials are utilized between conductors such as metal lines. The dielectric constant of the dielectric materials determines the capacitance between those metal lines. Generally the greater the capacitance the slower the operation of the lines. Slower operating speeds reduces performance of many integrated circuits.

Thus, it is desirable to provide dielectric constants of dielectric materials that are as low as possible. In addition, it is desirable that the dielectrics be deposited using chemical vapor deposition which is a well established process in the semiconductor industry.

Thus, there is a need for ways to provide mechanically robust low dielectric constant dielectric films that can be deposited by chemical vapor deposition.

BRIEF DESCRIPTION OF THE DRAWINGS

FIG. 5 is a depiction of the synthesis of m-TEOS-carborane in accordance with one embodiment of the present invention;

FIG. 6 is a depiction of ortho-triethylorthosilyl (TrEOS)-carborane in accordance with one embodiment of the present invention;

FIG. 7 is a depiction of meta-TrEOS-carborane in accordance with one embodiment of the present invention;

FIG. 8 is a depiction of para-TrEOS-carborane in accordance with one embodiment of the present invention;

FIG. 9 is a depiction of the synthesis of m-SiH$_3$-carborane in accordance with one embodiment of the present invention;

FIG. 10 is a depiction of ortho-SiH$_3$-carborane in accordance with one embodiment of the present invention;

FIG. 11 is a depiction of para-SiH$_3$-carborane in accordance with one embodiment of the present invention;

DETAILED DESCRIPTION

Figure 2:
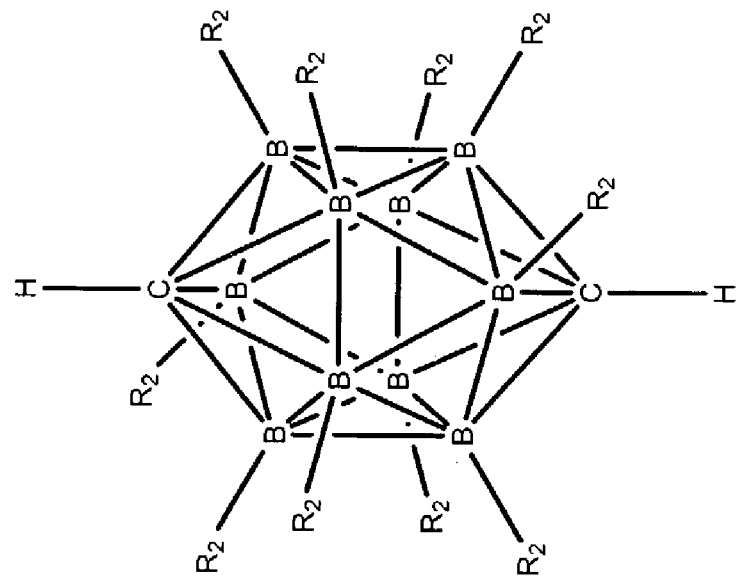
FIG. 2 is a depiction of a methyl or trifluoromethyl carborane molecule.
Figure 1:
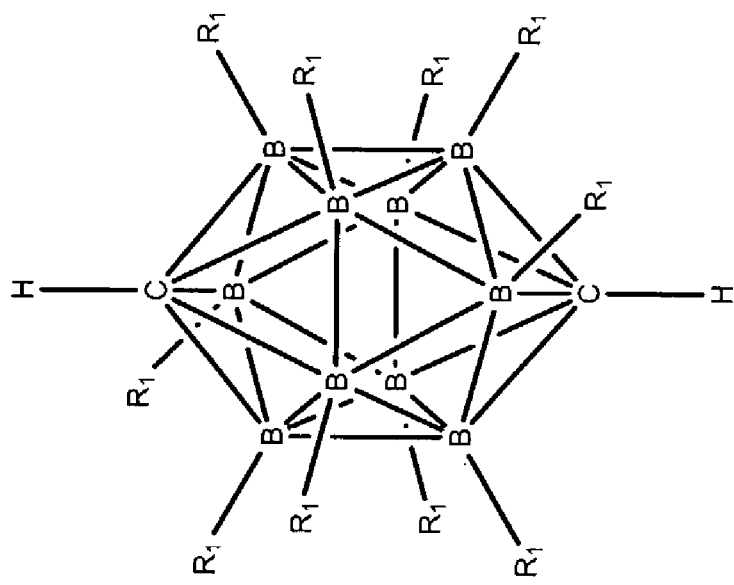
FIG. 1 is a depiction of a carborane molecule or a fluorinated carborane molecule.

A mechanically robust, low dielectric constant film can be formed by chemical vapor deposition using carborane. Carborane, shown in FIGS. 1 and 2, is a well known molecule precursor to high temperature non-oxide ceramics. The group $R_1$ may be hydrogen or fluorine, in FIG. 1, and $CH_3$ or $CF_3$ in FIG. 2. Carborane is a thermally stable caged structural molecule with a cage size of approximately 10 Angstroms or 1 nanometer from vertex-to-vertex van der Waals diameter. Other materials having a pore size less than two nanometers may also be used.

Thus, the carborane cage size is sufficiently small to provide a relatively closed pore. By introducing the carborane, a dielectric constant of a film can be reduced below 2.5 because the carborane is a non-polar organic moiety that possesses a low dielectric constant and because the cage structure of carborane reduces the density of the film, further reducing the dielectric constant.

Figure 4:
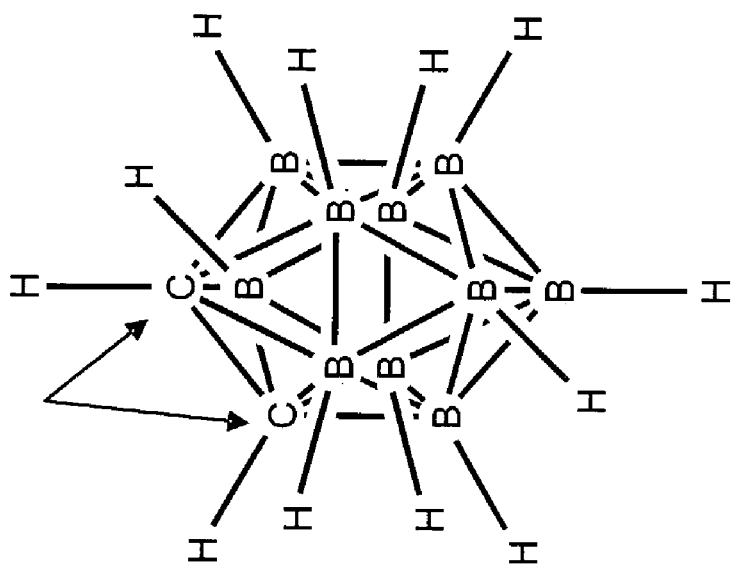
FIG. 4 is a depiction of ortho-carborane.
Figure 3:
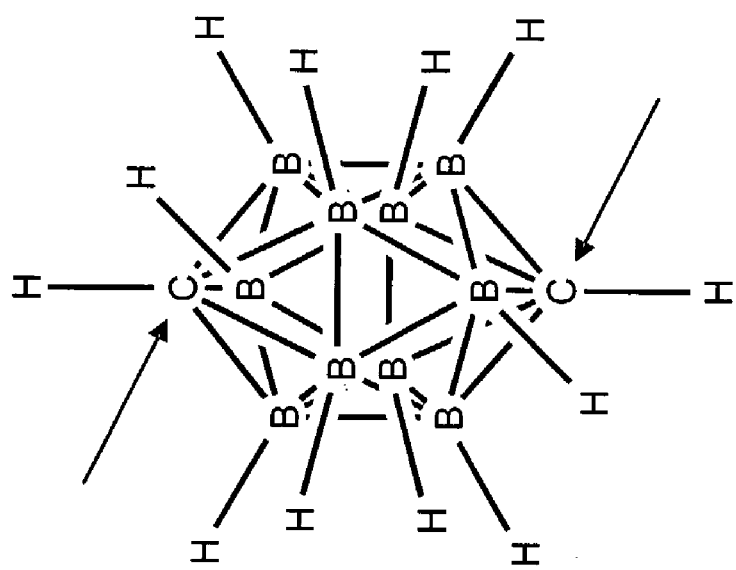
FIG. 3 is a depiction of para-carborane.
Figure 12:
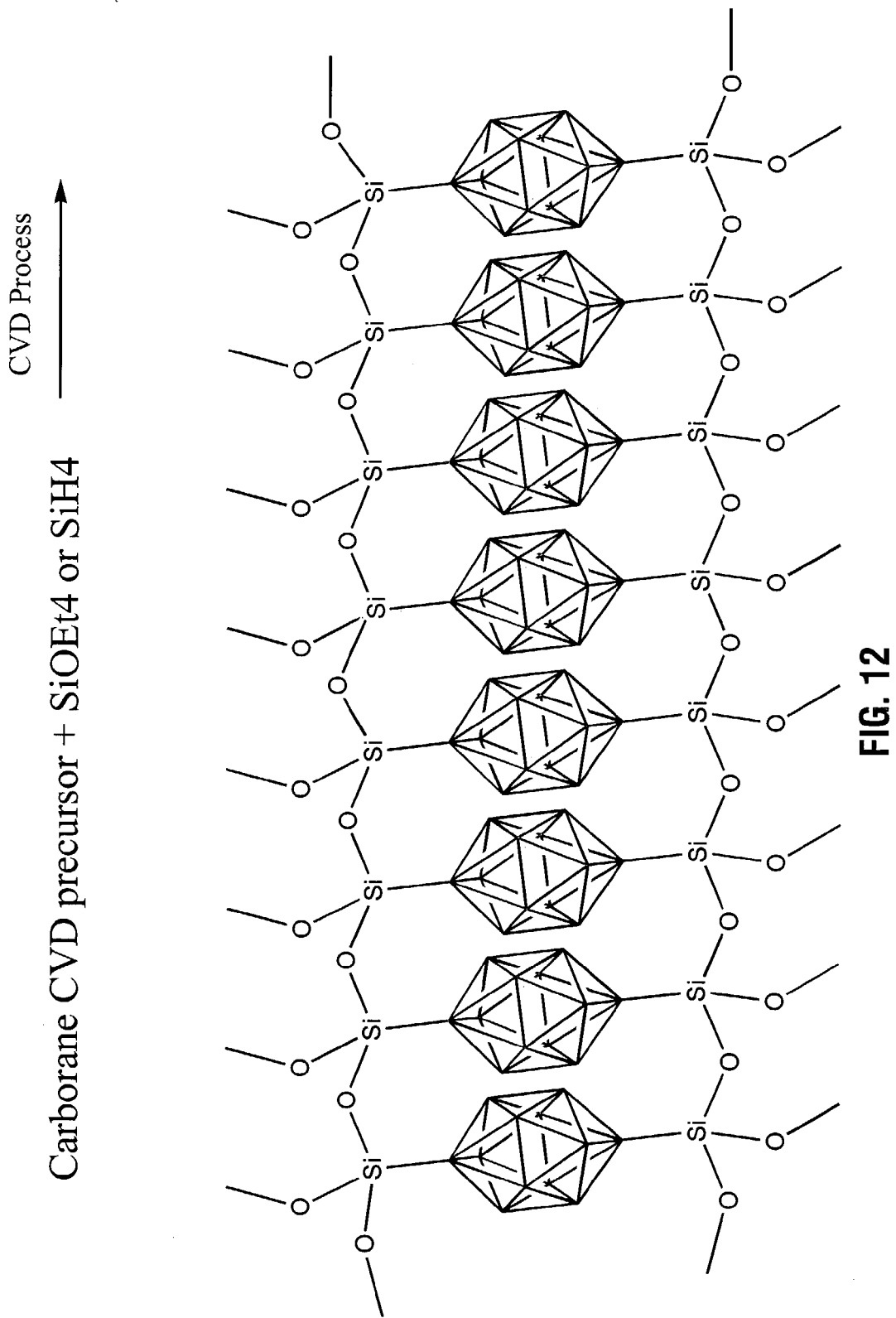
FIG. 12 is a depiction of para-SiH$_3$-carborane in accordance with one embodiment of the present invention.

Carborane has three isomers, p-carborane (FIG. 3), o-carborane (FIG. 4), and m-carborane (FIG. 5). Each isomer has two reactive C—H bonds. These bonds can be synthetically modified by triethoxy (or methoxy, propoxy, and butoxy) silanating agents or silinating agents to become depositable by chemical vapor deposition using triethylorthosilyl (TrEOS) or silyl (SiH3) functional carborane. In other words, by attaching TrEOS or silyl constituents, the carborane, which has desirable characteristics, may also be modified to be depositable by chemical vapor deposition.

TrEOS-carborane may be formed from a meta, ortho, or para isomer of carborane and a constituent of the form $XSiR'_3$ wherein X is a halogen or other reactive group, as shown in FIGS. 5 through 8 and $R'_3$ is an alkyl such as a methoxy, ethoxy, propoxy or butoxy group. Similarly, a meta, ortho, or para carborane, together with a constituent of the form $XSiH_3$ may be reacted to form an $SiH_3$-carborane as shown in FIGS. 9 through 12. Again, the X constituent may be a halogen.

Figure 13:
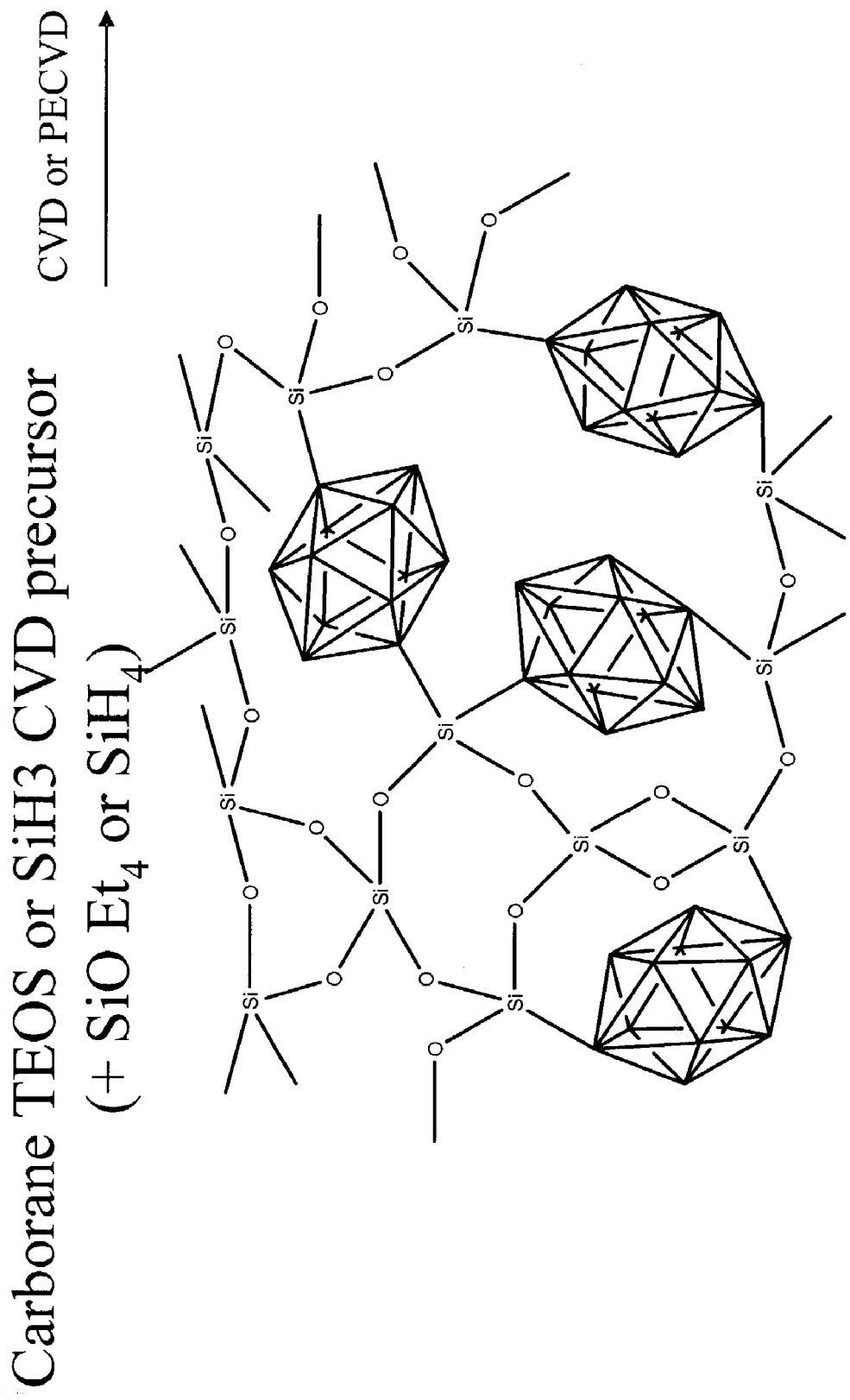
FIG. 13 is a depiction of synthesis of a three-dimensional carborane containing network in accordance with one embodiment of the present invention.

The TrEOS-carborane and SiH3-carborane are chemical vapor depositionable molecular precursors. These precursors (shown, for example, in FIGS. 1 through 12) can be deposited by themselves or co-deposited with $SiOEt_4$ (tetraethylorthosilicate; TEOS) or with $SiH_4$ (silane) to form a three-dimensional carborane containing oxide film shown in FIG. 13. Such a film may have a dielectric constant less than 2.5 and strong mechanical structural properties due to the small cage structure containing a three-dimensional network. The three-dimensional structure shown in FIG. 13, which is a three-dimensional structure, may be formed as a result of the use of a carborane CVD precursor plus TEOS in a chemical vapor deposition or plasma enhanced chemical vapor deposition in accordance with one embodiment of the present invention.

As a result, a mechanically strong low dielectric material may be deposited by chemical vapor deposition. The deposition can be done by chemical vapor deposition or plasma enhanced chemical vapor deposition (PECVD), leading to low dielectric constant carborane-deposited oxide thin films.

These thin films are stable since carborane is incorporated chemically into the three-dimensional film. They have relatively low dielectric constants because they are relatively non-polar and have low cage densities. The film has a closed pore structure with a uniform pore density of approximately one nanometer. The cage forms a relatively strong film that is chemically bonded into the oxide network. No carbon or fluorine doping may be needed which normally leads to out gassing and thermal stability problems. Existing equipment infrastructure may be utilized to chemically vapor deposit these precursors.

The carborane may be attached to other moieties including an alkyl moiety such as a methyl group (FIG. 1B) or a halogen such as fluorine or chlorine. Also, the carborane containing materials may be mixed with other dielectrics such as silicon dioxide, silicon nitride to reduce the dielectric constant of the composite material. Fluorine containing carboranes may have even lower dielectric constants (FIGS. 1A and 1B).

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a dielectric film on a semiconductor substrate by chemical vapor deposition wherein said film includes silane linked carborane linked to a constituent selected from the group consisting of tetraethyl, methyl, propyl, butyl, and orthosilicate.

2. The method of claim 1 including forming said film to have a caged molecular structure.

3. The method of claim 2 including forming said film with a pore size less than two nanometers.

4. The method of claim 3 including forming said film with a dielectric constant less than 2.5.

5. The method of claim 1 including forming said film with a pore size about one nanometer or less.

* * * * *